United States Patent [19]
Anderson et al.

[11] Patent Number: 5,892,396
[45] Date of Patent: Apr. 6, 1999

[54] METHOD AND APPARATUS FOR CONTROLLING GAIN OF A POWER AMPLIFIER

[75] Inventors: Mark B. Anderson, Algonquin; Brian D. Wiseman, Elgin, both of Ill.

[73] Assignee: Motorola, Inc., Schaumburg, Ill.

[21] Appl. No.: 903,891

[22] Filed: Jul. 31, 1997

[51] Int. Cl.⁶ .................................................. H03G 3/20
[52] U.S. Cl. ........................................ 330/129; 330/136
[58] Field of Search .................................. 330/129, 136, 330/140, 279; 455/126

[56] References Cited

U.S. PATENT DOCUMENTS

| | | | |
|---|---|---|---|
| 3,900,823 | 8/1975 | Sokal et al. | 330/129 X |
| 5,374,896 | 12/1994 | Sato et al. | 330/136 X |

*Primary Examiner*—Steven Mottola
*Attorney, Agent, or Firm*—Sayed Hossain Beladi

[57] ABSTRACT

A method and apparatus for controlling the gain of a power amplifier wherein the method includes the steps of attenuating, detecting, and comparing. An attenuator (108) attenuates an amplified version of a radio frequency signal to an attenuated level. A single detector (109) alternatively detects the radio frequency signal power level at a power amplifier (101) input and the attenuated version of the amplified radio frequency signal. The detector (109) produces a first and a second signal each having a DC level representing the detected power levels. An operation amplifier configured for closed loop operation compares the DC levels of the first and second signals to produce a control signal (102) for controlling power amplifier (101) gain. Filters (119) and (120) filter the first and second signals before the comparing step.

11 Claims, 1 Drawing Sheet

METHOD AND APPARATUS FOR CONTROLLING GAIN OF A POWER AMPLIFIER

FIELD OF THE INVENTION

The present invention relates to a method and apparatus for controlling gain of a power amplifier typically used in a radio frequency communication system.

BACKGROUND OF THE INVENTION

Radio frequency power amplifiers typically have significant gain variation over operating frequencies, temperatures and input drive levels. These variations typically have serious implications in a communication system base station where, according to an established standard, a radio frequency signal having a predetermined power level should be transmitted from the transmitting antenna. In response, a power control mechanism is often employed to control the signal power level at the antenna.

The hardware which controls the signal power level often resides in a controller connected to the antenna and power amplifier through coaxial cables. Therefore, to control the signal power level as being transmitted from the antenna, the controller attempts to accurately estimate the amount of signal power loss through cables and connectors, and the power amplifier gain.

Since the gain of a power amplifier is dependent on environmental factors, a feed back method is often employed. In this feed back method, the output power level is sampled by a radio frequency signal coupler. A detector receiving the sampled results produces a signal having a DC level corresponding to the detected power level. The DC signal is compared to a predetermined DC reference signal, and depending on the difference between the produced DC signal and the reference DC signal, the system controller accordingly adjusts the gain of the power amplifier. In this feedback method, however, the produced DC signal representing the actual transmitted power level has been affected by the temperature variation of the power detector, where such a variation can not accurately be introduced in the reference DC signal. As a result, the transmitted power level has inaccurately been estimated.

In a Code Division Multiple Access (CDMA) communication systems, the transmit power level of each carrier must be carefully controlled to utilize the system capacity. In CDMA systems, several carriers at different power levels are combined together before the combined signal is presented to the power amplifier for final amplification and subsequent transmission from the antenna. To control the power level of each carrier, each carrier power level is controlled independently before being combined with other carriers. As a result, the power amplifier gain must be known and maintained at a constant level at all environmental conditions, and power levels of carriers.

Therefore, there is a need to nullify the environmental factors and circuit variations to accurately estimate and maintain the gain of a power amplifier at a constant level in a CDMA communication system.

THE PREFERRED EMBODIMENT OF THE INVENTION

Figure 1:
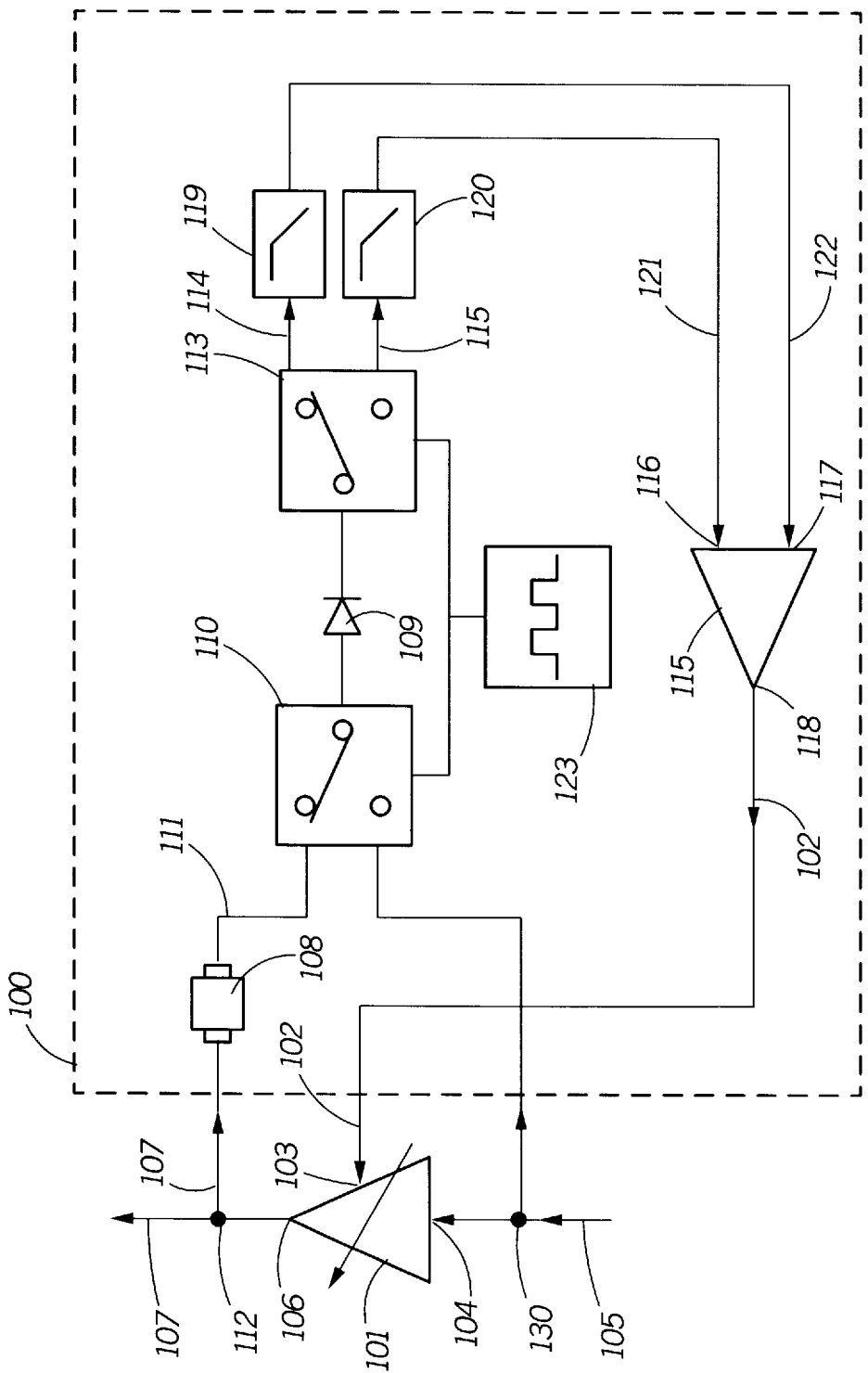
FIG. 1 depicts a controller coupled to an amplifier for controlling gain of the amplifier in accordance of the invention.

With reference to FIG. 1, a controller 100 controls gain of a power amplifier 101 according to the aspects of the present invention. The present invention is a method and apparatus for controlling gain of power amplifier 101. The method comprises the steps of attenuating, detecting, and comparing. Power amplifier 101 amplifies a radio frequency signal according to its gain which is adjusted according to a control signal 102. An attenuator 108 attenuates the amplified version of the radio frequency signal to an attenuated level. A single detector 109 alternatively detects the radio frequency signal power level at power amplifier 101 input at 130 and the attenuated version of the radio frequency signal at 111. The detector 109 produces a first and a second signal each having an average DC level representing the detected power levels. An operational amplifier 115 configured for closed loop operation compares the first and second signals DC levels to produce control signal 102 for controlling power amplifier 101 gain. Filters 119 and 120 filter the first and second signals before the comparing step to filter any amplitude ripples produced as the result of detector 109 alternatively detecting signal power levels.

With reference to FIG. 1, further aspects of the present invention are shown in gain controller 100. The gain controller 100 controls the gain of power amplifier 101 by producing control signal 102. The signal 102 has a DC level and is coupled to a gain control input 103 of power amplifier 101. The power amplifier 101 has an input 104 for receiving a first radio frequency signal 105 having a first power level, and an output 106 for outputting a second radio frequency signal 107 having a second power level. The difference between the first and second power levels is controlled according to the DC level of control signal 102.

In gain controller 100, the attenuator 108 input is coupled to power amplifier output 106 at 112. The attenuator 108 attenuates second radio frequency signal 107 from the second power level to an attenuated second power level. The attenuated signal is produced at output 111. Additionally, the signal power detector 109 through a radio frequency switch 110 alternatively coupling at 130 to power amplifier input 104 and at output 111 of attenuator 108 respectively detects first radio frequency signal 105 at the first power level at 130 and second radio frequency signal 107 at the attenuated second power level at 111. Through a DC signal switch 113, the detector 109 then produces respectively first and second signals, 115 and 114, each having an average DC level corresponding to the first power level at 130 and attenuated second power level at 111. The switches 113 and 110 are switched at the same time. Furthermore, when the switch 110 is connecting detector 109 to attenuator 108 output 111, the switch 113 is configured to produce signal 114. Similarly, when the switch 110 is connecting detector 109 to 130, the switch 113 is configured to produce signal 115.

The gain controller 100 further includes a first and a second low pass filters, 119 and 120, filtering first and second signals, 114 and 115, to produce filtered first and second signals, 121 and 122. The filters, 119 and 120, filter any amplitude ripples on signals 114 and 115 caused by alternatively switching detector 109 coupling to power amplifier 101 input 104 at 130 and attenuated output 111 of attenuator 108. Furthermore, an operational amplifier 115 having a positive input 116, a negative input 117 and an output 118 is configured to a closed loop operation to receive filtered first and second signals, 121 and 122, respectively at positive and negative inputs 116 and 117. The operational amplifier 115 then produces at its output 118 control signal 102 for adjusting the power amplifier 101 gain according to operational amplifier 115 closed loop operation and filtered first and second signals, 121 and 122, average DC levels.

In one aspect of the present invention, the attenuator 108 attenuation magnitude is substantially equal to the difference between the first and second power levels. The amount of attenuation is selected as a means to control the gain of power amplifier 101. The attenuation amount of an attenuator typically does not change with temperature and operating frequency variations. Thus, where the gain of power amplifier 101 is controlled based on the amount of attenuation in attenuator 108 according to the present invention, the gain of the power amplifier is maintained at a constant level over temperature and frequency variations.

To control the gain of power amplifier 101, the control signal 102 is produced by comparing signals 121 and 122. The difference between signals 121 and 122 is proportionally equal to the detected difference between first and attenuated second signal levels. Substantially, the attenuated second signal level is equal to the first signal level when attenuation amount of attenuator 108 is equal to the gain of power amplifier 101. As a result, the signal 102 has a DC level that when applied to power amplifier 101 gain control input 103, it causes power amplifier 101 gain to be equal to the attenuation level of attenuator 108 according to the present invention.

The signals detected by detector 109 are originally coupled at 112 and 130. The couplings at 112 and 130 may be performed through directional couplers not shown in the FIG. 1. These couplings cause signal level drop which must be taken into consideration for adjusting the gain of power amplifier 101. The gain of power amplifier 101 in measure of decibel unit is equal to coupling loss at 112 plus attenuation of 108 minus coupling loss at 130.

According to another aspect of the present invention in gain controller 100, the signal level detections of first signal 105 and attenuated second signal 107 are performed by one detector, shown as detector 109. Since one detector is used, the variations of signal level detection produced as a result of frequency and temperature variations are nullified at operational amplifier 115 positive and negative inputs 116 and 117. Furthermore, by selecting the amount of attenuation of attenuator 108 substantially equal to the desired power amplifier gain, power detector 109 detects two signals that are substantially at the same level. As a result, a nonlinearity of detector 109 due to large signal amplitude variation is passivated.

The gain controller 100 further includes a clock source 123 mutually coupled to radio frequency switch 110 and DC signal switch 113. The clock source 123 alternatively signals switch 110 to switch the coupling path from radio frequency detector 109 input to either power amplifier input 104 or output 111 of attenuator 108. Furthermore, the clock source 123 coupled to DC signal switch 113 alternatively signals switch 113 to switch the coupling path from detector 109 output to inputs of either first or second low pass filters, 120 and 119. The switching actions in 110 and 113 occurs simultaneously.

While the invention has been particularly shown and described with reference to a particular embodiment, it will be understood by those skilled in the art that various changes in form and details may be made therein without departing from the spirit and scope of the invention. The corresponding structures, materials, acts and equivalents of all means or step plus function elements in the claims below are intended to include any structure, material, or acts for performing the functions in combination with other claimed elements as specifically claimed.

What is claimed is:

1. A gain controller for controlling gain of a power amplifier, said power amplifier having an input for receiving a first radio frequency signal at a first power level, an output for outputting a second radio frequency signal at a second power level, whereby a difference between said first and second power levels is controlled by controlling said power amplifier gain according to a DC level of a control signal coupled to a gain control input of said power amplifier, comprising:

an attenuator having an input coupled to said power amplifier output for attenuating said second radio frequency signal from said second power level to an attenuated second power level;

a signal power detector coupled alternatively via a radio frequency switch to said power amplifier input and an output of said attenuator, said detector detecting said first radio frequency signal at said first power level and said second radio frequency signal at said attenuated second power level, and producing via a DC signal switch a first and a second signal each having an average DC level corresponding to said first and attenuated second power levels; and an operational amplifier, configured for closed loop operation, having a positive input, a negative input and an output, said first and second signals coupled respectively to said positive and negative inputs, and said output producing said control signal according to said operational amplifier closed loop operation and said first and second signals average DC level.

2. The gain controller as recited in claim 1, further comprising:

a first low pass filter filtering said first signal before being coupled to said positive input of said operational amplifier; and a second low pass filter filtering said second signal before being coupled to said negative input of said operational amplifier.

3. The gain controller as recited in claim 1 wherein said attenuator attenuation magnitude is substantially equal to said difference between said first and second power levels.

4. The gain controller as recited in claim 2 further comprising a clock source coupled to said radio frequency switch to alternatively switch coupling path from said power amplifier input and said output of said attenuator to said radio frequency detector.

5. The gain controller as recited in claim 4 wherein said clock source is further coupled to said DC signal switch to alternatively switch coupling path from said detector to inputs of said first and second low pass filters.

6. The gain controller as recited in claim 5 wherein said DC signal switch and said radio frequency switch switching actions take place at the same time.

7. A method of controlling gain of a power amplifier, comprising the steps of:

attenuating an amplified version of a radio frequency signal to produce an attenuated version, said amplified version of said radio frequency signal being amplified through a power amplifier having a gain controlled by a control signal;

switching alternatively, to a power detector, said attenuated version of said radio frequency signal and said radio frequency signal at said power amplifier input;

detecting alternatively at said power detector said attenuated version power level and a power level of said radio frequency signal at said power amplifier input and producing respectively therefrom a first and a second signal, each of said first and second signal having a DC level corresponding to said detected power levels; and comparing said first and second signals DC levels to produce said control signal.

8. The method as recited in claim 7 further comprising the step of filtering said first and second signals before said comparing step.

9. The method as recited in claim 7 wherein said attenuating step said amplified version of said radio frequency signal is attenuated substantially equal to said power amplifier gain.

10. The method as recited in claim 7 wherein said comparing step produces said control signal at a DC level which adjusts said power amplifier gain to a level substantially equal in absolute decibel to an amount of attenuation performed in said attenuating step.

11. A method of controlling gain of a power amplifier as recited in claim 7 further comprising the step of switching alternatively said first and second signals to a comparator.

* * * * *